Figure 1:
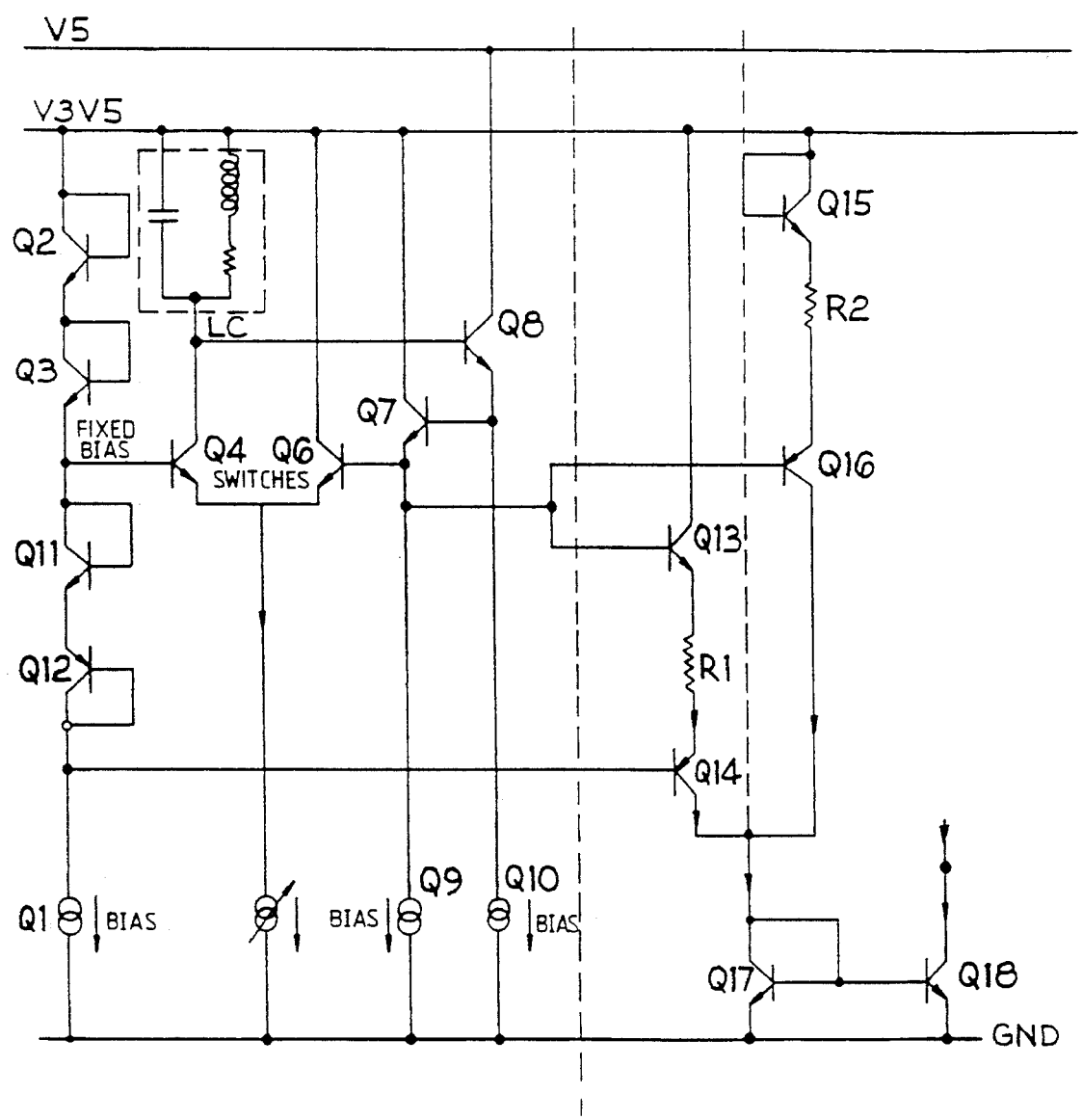

United States Patent
Calder et al.

[11] Patent Number: 5,463,354
[45] Date of Patent: Oct. 31, 1995

[54] PROXIMITY SWITCHES INCLUDING LONG TAIL PAIR WITH EMITTER FOLLOWER FEEDBACK

[75] Inventors: Douglas W. Calder, Berkshire; Arthur J. Bizley, Wiltshire, both of Great Britain

[73] Assignee: Square D Company, Palatine, Ill.

[21] Appl. No.: 244,827

[22] PCT Filed: Dec. 28, 1992

[86] PCT No.: PCT/US92/11233

§ 371 Date: Jun. 15, 1994

§ 102(e) Date: Jun. 15, 1994

[87] PCT Pub. No.: WO93/13436

PCT Pub. Date: Jul. 8, 1993

[30] Foreign Application Priority Data

Dec. 31, 1991 [GB] United Kingdom .............. 9127570

[51] Int. Cl.⁶ .............. G01V 3/11; H03B 5/12; H03K 17/945
[52] U.S. Cl. .............. 331/65; 331/75; 331/117 R; 324/207.16; 324/207.26; 324/236; 324/327; 307/116; 361/180
[58] Field of Search .............. 331/65, 75, 117 R; 324/207.16, 207.26, 236, 327; 307/116; 361/180; 340/941

[56] References Cited

U.S. PATENT DOCUMENTS

| | | | |
|---|---|---|---|
| 4,652,819 | 3/1987 | Kammerer | 331/65 |
| 4,968,953 | 11/1990 | Kanda et al. | 331/65 |
| 5,029,300 | 7/1991 | Ishibashi et al. | 331/65 |

*Primary Examiner*—Siegfried H. Grimm
*Attorney, Agent, or Firm*—Michael J. Femal; Larry T. Shrout; Larry I. Golden

[57] ABSTRACT

A proximity switch circuit including first and second transistors Q4, Q6 connected as a long tail pair with an inductive sensing circuit LC connected to one leg thereof and an emitter follower circuit Q7, Q8 connected between said one leg and the base of the transistor of the other leg, whereby an oscillator circuit can be provided which is non-critically damped to enable faster speed of operation of the proximity switch.

8 Claims, 4 Drawing Sheets

PROXIMITY SWITCHES INCLUDING LONG TAIL PAIR WITH EMITTER FOLLOWER FEEDBACK

This invention relates to proximity switches or sensors, and in particular to an oscillator/rectifier for use in inductive proximity switches.

Accordingly, a first aspect of the present invention provides a proximity switch circuit including first and second transistors connected as a long tail pair with an inductive sensing circuit connected to one leg thereof and an emitter follower circuit connected between said one leg and the base of the transistor of the other leg, whereby an oscillator circuit can be provided which is non-critically damped to enable faster speed of operation of the proximity switch.

A second aspect of the present invention provides an oscillator for use in inductive proximity switches comprising a long tail pair having first and second transistors with first and second legs extending to a first supply rail from respective collectors and a tail extending between respective emitters to a second supply rail via a First constant current source, a sense coil network associated with a coil of the proximity switch being provided between the first transistor and the first supply rail, and the base of the first transistor being held at a fixed bias by a second constant current source, further comprising an emitter follower circuit having third and fourth transistors, the emitter of the third being connected to the base of the fourth, the collectors of the third and fourth transistors being connected to a third supply rail and the first/third supply rail respectively, the emitters of the third and fourth transistors being connected to the second supply rail via third and fourth constant current sources, the base of the third transistor being connected to the collector of the first transistor, while the emitter of the fourth transistor is connected to the base of the second transistor.

The transistors may all be NPN bipolar transistors.

The second constant current source may be connected to the first supply rail via fifth, sixth and seventh diode connected NPN transistors and a first PNP diode connected transistor, and directly to the second supply rail, the base of the first transistor being connected between the emitter of the sixth transistor and the collector of the seventh transistor.

According to a third aspect of the present invention there is provided a rectifier, for use with an oscillator according to the first or second aspects, comprising an eighth NPN transistor the base and collector of which are connected to the first supply rail, the emitter of which is connected in series with a first resistor to the emitter of a second PNP transistor the collector of which is connected directly or indirectly to an integrator, further comprising a ninth NPN transistor the base of which is connected to the emitter of the fourth transistor and also to the base of the second PNP transistor, and the collector of which is connected to the first supply rail, the emitter of which is further connected in series with a second resistor to the emitter of a third PNP transistor, the collector of which is connected directly or indirectly to an integrator, and the base of which is connected to the second current source.

Regarding the oscillator, the collector of the fourth transistor may be connected to the third supply rail, and further one end of the second current source is connected to the first supply rail via the base to emitter junction of a fifth NPN transistor and a diode connected sixth NPN transistor, the collector of the fifth transistor being connected to the third supply rail, and the base of the first transistor being connected between the emitter of the sixth transistor and the one end of the second current source, the other end of the current source being connected to the second supply rail.

In this case the rectifier may comprise an eighth NPN transistor the base of which is connected to the first supply rail, the collector of which is connected to the third supply rail, and the emitter of which is connected in series with a first resistor to the emitter of a first PNP transistor the collector of which is connected directly or indirectly to a integrator, and the base of which is connected to the base of the second transistor, further comprising a ninth NPN transistor the base of which is connected to the collector of the first transistor, and the collector of which is connected to the third supply rail, the emitter of which is further connected in series with a second resistor to the emitter of a second PNP transistor the collector of which is connected directly or indirectly to an integrator, and the base of which is connected to the base of the first transistor and to the second current source.

Further, the rectifier may comprise a tenth NPN transistor the base of which is connected to the first supply rail, the collector of which is connected to the third supply rail and the emitter of which is connected via a third resistor to the emitter of a third PNP transistor, the base of which is connected to the base of the second PNP transistor and the collector of which is connected to one side of a times two current mirror, the other side of the current mirror being connected to the collector of the second PNP transistor.

Figure 2:
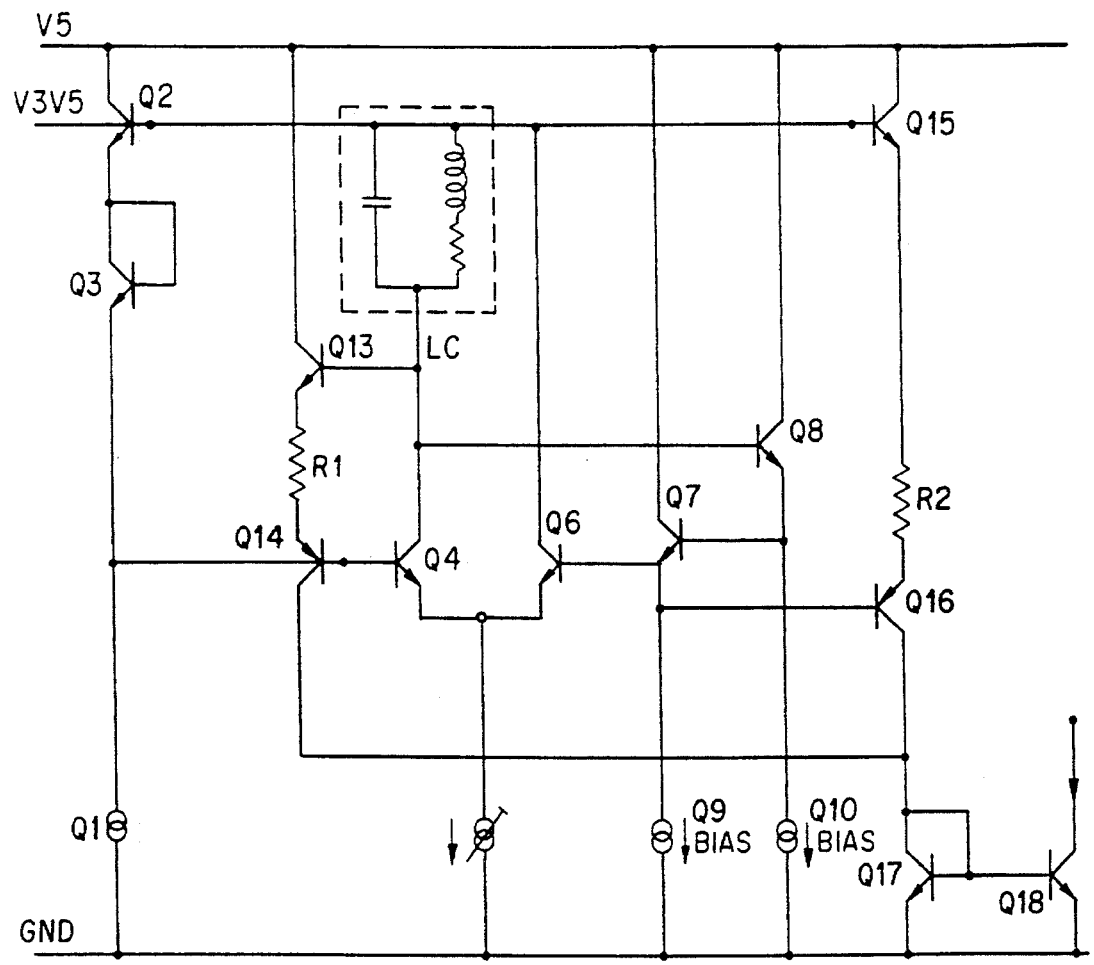
Figure 3:
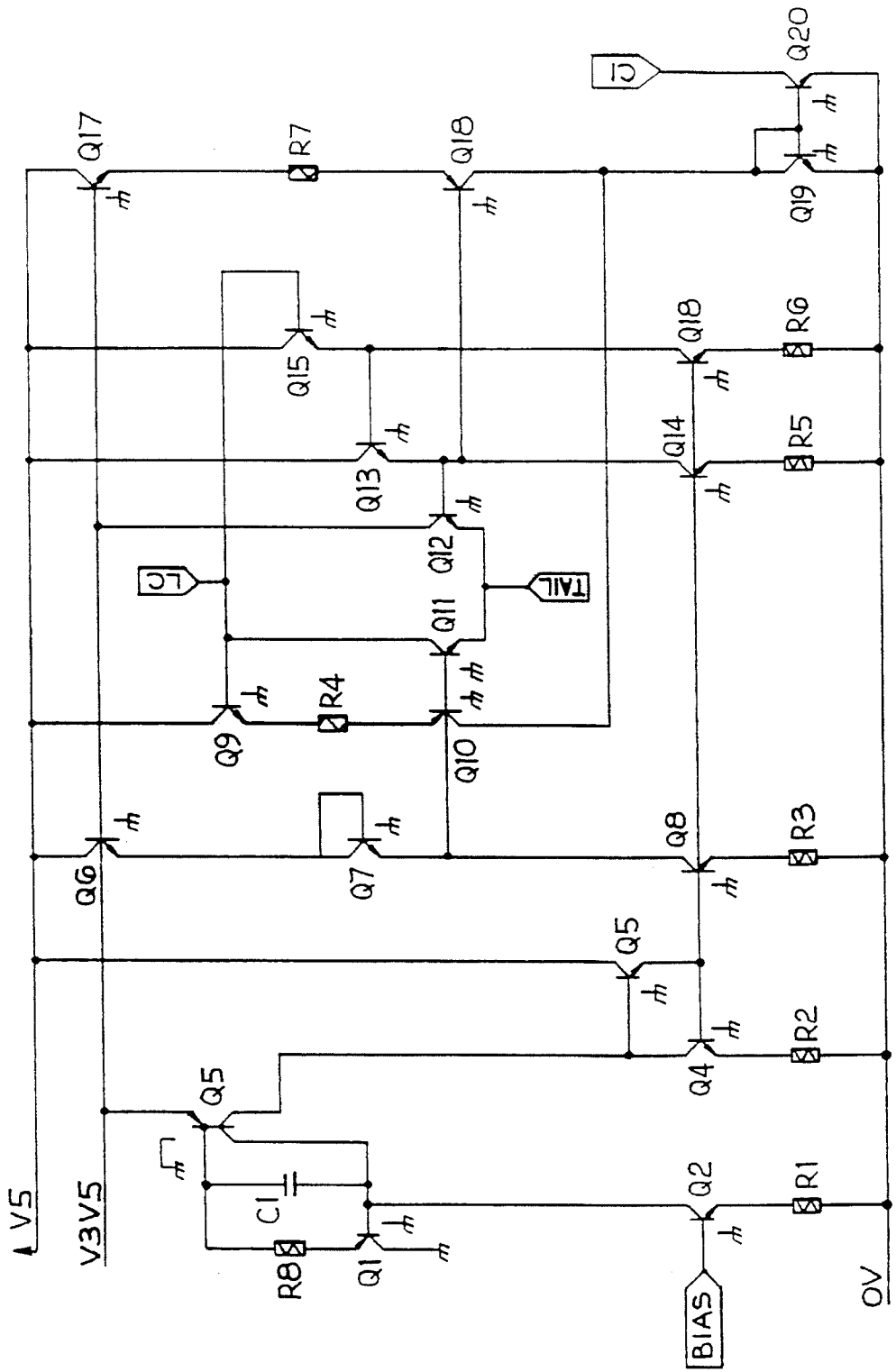
Figure 4:
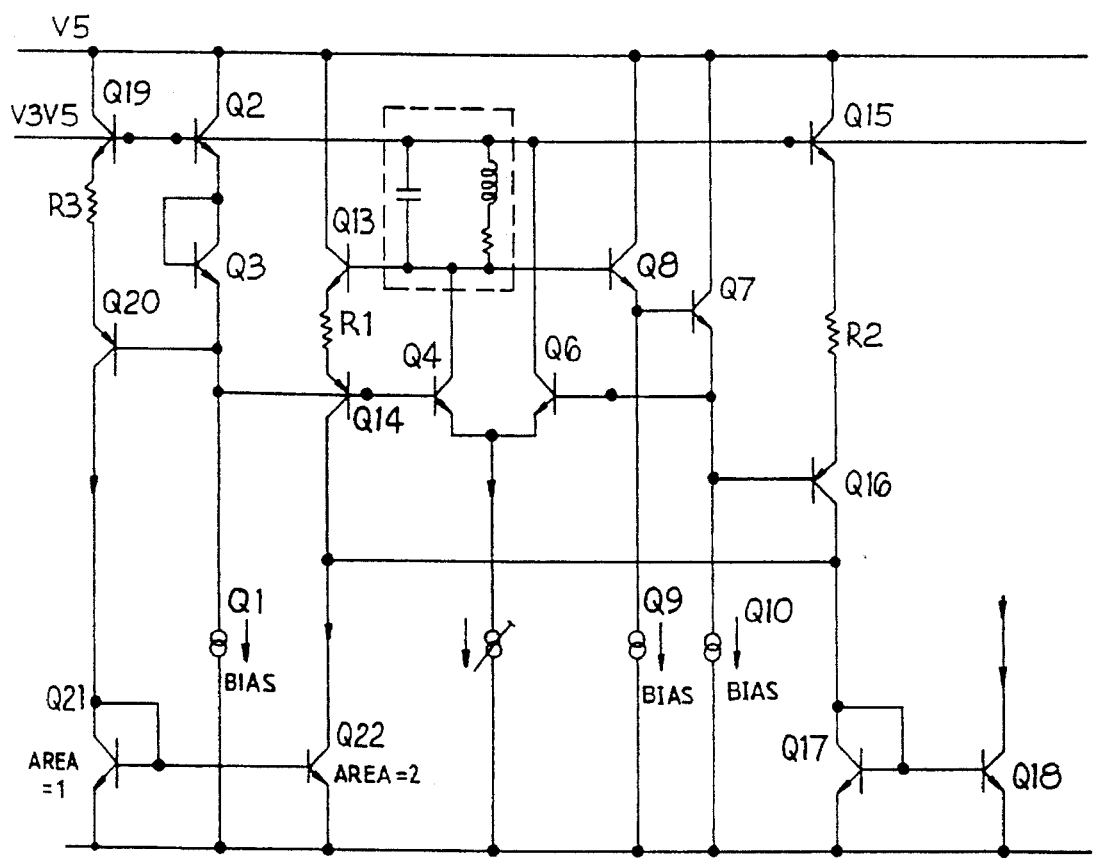

Three embodiments of the present invention will now be described by way of example only with reference to the accompanying drawings which are:

FIG. 1 a schematic circuit diagram of a first embodiment of an oscillator/rectifier according to the present invention;

FIG. 2 a schematic circuit diagram of a second embodiment of an oscillator/rectifier according to the present invention;

FIG. 3 a more detailed schematic circuit diagram of the oscillator/rectifier of FIG. 2; and FIG. 4 a schematic circuit diagram of a third embodiment of an oscillator/recitifier according to the present invention.

FIRST EMBODIMENT

Referring to FIG. 1, there is illustrated an oscillator for use in inductive proximity switches, and a rectifier for use with the oscillator.

The oscillator comprises a long tail pair having first and second transistors Q4, Q6 with first and second legs extending to a first supply rail V3V5 from respective collectors and a tail extending between respective emitters to a second supply rail GND via a first constant current source ITAIL. A sense coil network associated with a coil of the proximity switch is provided between the first transistor Q4 and the first supply rail V3BV5, and the base of the first transistor Q4 is held at a fixed bias by a second constant current source Q1. The oscillator further comprises an emitter follower circuit having third and fourth transistors Q8, Q7, the emitter of the third Q8 being connected to the base of the fourth Q7, the collectors of the third and fourth transistors 08, Q7 bring connected to a third supply rail V5 and the first supply rail V3V5 respectively. The emitters of the third and fourth transistors QS, Q7 are further connected to the second supply rail GND via third and fourth constant current sources Q9, Q10, the base of the third transistor Q8 being connected to the collector of the first transistor Q4, while the emitter of the fourth transistor Q7 is connected to the base of the second transistor Q6.

The second constant current source Q1 is connected to the first supply rail via fifth, sixth and seventh diode connected NPN transistors Q2, Q3, Q11 and a first PNP diode connected transistor Q12, and directly to the second supply rail GND. The base of the first transistor Q4 is connected between the emitter of the sixth transistor Q3 and the collector of the seventh transistor Q11.

The rectifier, for use with the aforementioned oscillator, comprises an eighth NPN transistor Q15 the base and collector of which are connected to the first supply rail V3V5, the emitter of which is connected in series with a first resistor R2 to the emitter of a second PNP transistor Q16 the collector of which is connected indirectly to an integrator. The rectifier further comprises a ninth NPN transistor Q13 the base of which is connected to the emitter of the fourth transistor Q7 and also to the base of the second PNP transistor Q16, and the collector of which is connected to the first supply rail V3V5, the emitter of which is further connected in series with a second resistor R1 to the emitter of a third PNP transistor Q14, the collector of which is connected indirectly to the integrator, and the base of which is connected to the second current source Q1. The collector of the second PNP transistor Q16 and the emitter of the third PNP transistor Q14 are connected to the integrator via a suitable current mirror arrangement comprising tenth and eleventh NPN transistors Q17, Q18.

Regarding the oscillator, the collector of the fourth transistor Q7 may be alternatively connected to the third supply rail V5.

In the aforementioned first embodiment the transistors may all be NPN or PNP bipolar type transistors.

In use, the sense coil network LC will oscillate sinusoidally about the reference voltage V3V5 when stimulated by Q4 collector current. This signal is fed via emitter followers Q7 and Q8 to the base of Q6, completing the oscillator regenerative loop. The emitter followers Q7 and Q8 are biased equally by bias currents Q9 and Q10. The quiescent operating point of Q6 base is Q7 Vbe plus Q8 Vbe below the reference voltage V3V5. The base potential of Q4 is set to the same voltage by the Vbe voltages of Q2 and Q3, biased by the current Q1.

The rectifier works in two parts, one for the negative half cycle of the oscillator, and one for the positive half cycle. The resulting half cycles of signal current are added at the common collector/base node of Q17 and subsequently fed to an integrator via the mirror transistor Q18.

On the negative half cycle, when the base of Q6 swings below its quiescent voltage, Q16 conducts causing current to flow in R2 and Q15. The value of R2 is chosen such that at the peak of the negative swing the current in R2 is equal to the bias currents Q1, Q9 and Q10. At this current the Vbe potential drop of Q15 and Q16 cancels the Vbe potential drop of Q7 and Q8, causing the current in R2 to be proportional to the peak negative signal voltage across the coil network. During this negative half cycle Q13 is cut off, and no current flows in R1.

On the positive half cycle Q16 is cut off and Q13 conducts, causing current to flow in R1 and Q14. The value of R1 is chosen such that at the peak of the positive swing, the current in R1 is equal to the bias currents Q1, Q9 and Q10. At this current the Vbe potential drop of Q13 and Q14 cancels the Vbe potential drop of Q11 and Q12, and the Vbe potential drop of Q7 and Q8 cancels the Vbe potential drop of Q2 and Q3, causing the current in R1 to be proportional to the peak positive signal across the coil network.

The signal currents in Q13, R1 and Q14, and Q16, R2 and Q15, flow unidirectionally in the diode connected transistor, Q17, and are made available to an integrator via Q18.

There are two problems in the first embodiment herein-before described. The first is that the Vbe potential drops in Q15 and Q16 do not exactly cancel the Vbe potential drops in Q7 and Q8 as Q7 is a NPN transistor, whereas Q16 is a PNP transistor. The second is that at the "zero" crossing point of the tuned circuit voltage waveform, there will be some "leakage" current flowing in both Q13 and Q16. These problems result in unequal half cycles of current being provided to an integrator plus a steady state error current.

Additional modifications can be made to reduce the load current of the reference supply V3V5.

SECOND EMBODIMENT

The first modification which can be made to the first embodiment, is as shown in a second embodiment of the invention, as illustrated in FIG. 2.

The second embodiment substantially resembles the first embodiment, excepting the differences which are apparent from FIG. 2, some of which are discussed more fully, hereinafter, like components being referred to by like number.

The second embodiment differs from the first embodiment in the following respects:

In the second embodiment the second current source Q1 is connected to the first supply rail V3V5 via the base to emitter junction of a fifth NPN transistor Q2 and a diode connected sixth NPN transistor Q3, the collector of the fifth transistor Q2 being connected to the third supply rail V5, and the base of the first transistor Q4 being connected between the emitter of the sixth transistor Q3 and the one end of the second current source Q1, the other end of the current source Q1 being connected to the second supply rail GND.

Further, in this second embodiment, the rectifier comprises an eighth NPN transistor Q15, the base of which is connected to the first supply rail V3VS, the collector of which is connected to the third supply rail V5, and the emitter of which is connected in series with a first resistor R2 to the emitter of a first PNP transistor Q16 the collector of which is connected indirectly to an integrator, and the base of which is connected to the base of the second transistor Q6, further comprising a ninth NPN transistor Q13 the base of which is connected to the collector of the first transistor Q4, and the collector of which is connected to the third supply rail V5, the emitter of which is further connected in series with a second resistor R1 to the emitter of a second PNP transistor Q14 the collector of which is connected indirectly to the integrator, and the base of which is connected to the base of the first transistor Q4 and to the second current source Q1.

In this second embodiment, the basic idea of cancelling bias Vbe drops is still followed and, in spite of the errors in Vbe cancellation, the negative half cycle part of the rectifier circuit is retained. The positive half cycle part of the rectifier is repositioned in order to create exactly the same error, and thus make the amplitude of the two half cycle circuits equal. In addition the diode connected transistors Q2 and Q15 are re-arranged to become emitter followers with their bases connected to the reference supply V3V5 and their collectors supplied from V5. The repositioned emitter followers Q13 collector and the collector of Q2 are also supplied from V5. This modification drastically reduces the load on V3V5.

The oscillator and negative half cycle rectifier operate in the same way as in the first embodiment. The positive half cycle rectifier works by the same mechanism, but the signal input to Q13 base is from Q4 collector (LC) with a quiescent voltage of V3VS, and the bias point of Q14 base is two Vbe potential drops down from V3V5 at Q4 base via Q2 and Q3. Thus with Q2, Q3, Q13 and Q14 Vbe cancellation the positive half wave signal voltage appears across R1 causing a proportional signal current flow in Q17 and Q18.

The two halves of the rectifier system are now symmetrical and the difference between the positive and negative peak signal currents is avoided. The fixed error at a given temperature, due to the Vbe differential between one NPN transistor and one PNP transistor (rectifier) will be trimmed out by the sensing distance adjustment of a complete product. The Vbe change between NPN and PNP with temperature will be negligible.

A more detailed schematic circuit diagram of the second embodiment is shown in FIG. 3.

THIRD EMBODIMENT

There remains the "leakage" current offset that occurs at the zero crossing point of the signals applied to the rectifier. A modification designed to deal with this is given in a third embodiment of the invention, as illustrated in FIG. 4.

The third embodiment substantially resembles the first and second embodiments, excepting the differences which are apparent from FIG. 4 one of which is discussed more fully hereinafter, like components being referred to by like number.

The third embodiment differs from the second in the following aspects:

In the third embodiment the rectifier comprises a tenth NPN transistor Q19 the base of which is connected to the first supply rail V3V5, the collector of which is connected to the third supply rail V5 and the emitter of which is connected via a third resistor R3 to the emitter of a third PNP transistor Q20, the base of which is connected to the base of the second PNP transistor Q14 and the collector of which is connected to one side of a times two current mirror Q21, Q22, the other side of the current mirror Q21, Q22 being connected to the collector of the second PNP transistor Q14.

In this third embodiment, a network exactly the same as one half of the rectifier is used but permanent biased between V3V5 reference and the oscillator quiescent base voltage at Q2 base. Using the same value of resistor as in the rectifier, the current that flows will be the same as in one half of the rectifier at the zero crossing point. This current is doubled in a 1:2 area current mirror and subtracted from the signal current being supplied to Q17. Thus the "leakage" current offset of the rectifier is compensated. Because the network is identical, the compensation will track with temperature.

The oscillator and rectifier operate exactly as described for the second embodiment. The additional compensation circuitry functions as follows. An NPN transistor Q19 has its base connected to the reference V3V5 and PNP transistor Q20 has its base connected to the oscillator bias point at Q14 base. Q19 and Q20 emitters are connected via a resistor R3, in exactly the same way as the two halves of the rectifier using exactly the same value of resistors. The collector of Q19 is supplied by the rail V5. The potential difference between Q2/Q3 Vbe's and Q19/Q20 Vbe's will cause a current to flow in R3 and then in Q20 collector. This current is exactly the same as the error in one (either) half of the rectifier. Q20 collector is connected to the 1:2 area ratio current mirror Q21/Q22 and causes twice the error current to flow into Q22 collector. Q22 collector is connected to the signal current summing node at Q14/Q16 collectors and extracts the equivalent to the error current created by the two halves of the rectifier.

Until now, when a critically damped oscillator is used in inductive proximity sensors there is no electrical information regarding the target position when the target is closer than the detection distance. This is detrimental to the speed of operation of the proximity sensor when the target is removed. The oscillator described herein, according to the present invention, is not critically damped and, therefore, offers performance improvement in this respect.

When half wave rectification or peak detection of the oscillator signal is used, as has been the case in previous sensors, the ripple current flowing in the integrating capacitor is higher, thus requiring a larger value of integrating capacitor to avoid false triggering of the sensor. This further limits the speed of operation. The rectifier described herein is a full wave rectifier which improves the ripple rejection even for low values of integrating capacitor.

Further, with the critically damped oscillator the setting of the point of target detection is not easily predictable, and is non-linear. This causes difficulty in applying coil temperature co-efficient compensation to the oscillator. Again, the oscillator according to the present invention described herein seeks to overcome this difficulty.

Finally, it should be appreciated that the embodiments of the invention hereinbefore described, are given by way of example only and are in no way meant to limit the scope of the invention in any way.

We claim:

1. A proximity switch circuit including first and second transistors connected as a long tail pair with an inductive sensing circuit connected to one leg thereof and an emitter follower circuit connected between said one leg and the base of the transistor of the other leg, whereby an oscillator circuit can be provided which is non-critically damped to enable faster speed of operation of the proximity switch.

2. An oscillator for use in inductive proximity switches comprising a long tail pair having first and second transistors with first and second legs extending to a first supply rail from respective collectors and a tail extending between respective emitters to a second supply rail via a first constant current source, a sense coil network associated with a coil of the proximity switch being provided between the first transistor and the first supply rail, and the base of the first transistor being held at a fixed bias by a second constant current source, further comprising an emitter follower circuit having third and fourth transistors, the emitter of the third being connected to the base of the fourth, the collectors of the third and fourth transistors being connected to a third supply rail and one of the first and third supply rail respectively, the emitters of the third and fourth transistors being connected to the second supply rail via third and fourth constant current sources, the base of the third transistor being connected to the collector of the first, while the emitter of the fourth transistor is connected to the base of the second transistor.

3. An oscillator as claimed in claim 2, wherein the transistors are all NPN bipolar transistors.

4. An oscillator as claimed in claim 3, wherein the second constant current source is connected to the first supply rail via fifth, sixth and seventh diode connected NPN transistors and a first PNP diode connected transistor, and directly to the second supply rail, the base of the first transistor being connected between the emitter of the sixth transistor and the collector of the seventh transistor.

5. An oscillator as claimed in claim 2, wherein the collector of the fourth transistor is connected to the third supply rail, and further one end of the second current source is connected to the first supply rail via the base to emitter junction of a fifth NPN transistor and a diode connected sixth NPN transistor, the collector of the fifth transistor being connected to the third supply rail, and the base of the first transistor being connected between the emitter of the sixth transistor and the one end of the second current source, the other end of the current source being connected to the second supply rail.

6. A rectifier for use with the oscillator of claims 2 or 3 comprising an eighth NPN transistor the base and collector of which are connected to the first supply rail, the emitter of which is connected in series with a first resistor to the emitter of a second PNP transistor the collector of which is connected directly or indirectly to an integrator, further comprising a ninth NPN transistor the base of which is connected to the emitter of the fourth transistor and also to the base of the second PNP transistor, and the collector of which is connected to the first supply rail, the emitter of which is further connected in series with a second resistor to the emitter of a third PNP transistor, the collector of which is connected directly or indirectly to the integrator, and the base of which is connected to the second current source.

7. A rectifier for use with the oscillator of claim 5, comprising an eighth NPN transistor the base of which is connected to the first supply rail, the collector of which is connected to the third supply rail, and the emitter of which is connected in series with a first resistor to the emitter of a first PNP transistor the collector of which is connected directly or indirectly to an integrator, and the base of which is connected to the base of the second transistor, further comprising a ninth NPN transistor the base of which is connected to the collector of the first transistor, and the collector of which is connected to the third supply rail, the emitter of which is further connected in series with a second resistor to the emitter of a second PNP transistor the collector of which is connected directly or indirectly to the integrator, and the base of which is connected to the base of the first transistor and to the second current source.

8. A rectifier as claimed in claim 7, further comprising, a tenth NPN transistor the base of which is connected to the first supply rail, the collector of which is connected to the third supply rail and the emitter of which is connected via a third resistor to the emitter of a third PNP transistor, the base of which is connected to the base of the second PNP transistor and the collector of which is connected to one side of a times two current mirror, the other side of the current mirror being connected to the collector of the second PNP transistor.

* * * * *